United States Patent [19]

Sempel

[11] Patent Number: 4,628,281
[45] Date of Patent: Dec. 9, 1986

[54] FEEDBACK AMPLIFIER WITH REDUCED DISTORTION

[75] Inventor: Adrianus Sempel, Eindhoven, Netherlands

[73] Assignee: U.S. Philips Corporation, New York, N.Y.

[21] Appl. No.: 798,081

[22] Filed: Nov. 14, 1985

[30] Foreign Application Priority Data

Nov. 22, 1984 [NL] Netherlands ........................ 8403549

[51] Int. Cl.[4] .............................................. H03F 3/04
[52] U.S. Cl. .................................... 330/288; 330/293; 330/299; 330/310
[58] Field of Search ............... 330/299, 288, 310, 311, 330/293; 323/315, 316

[56] References Cited

U.S. PATENT DOCUMENTS 4,340,869 7/1982 Van Mil ............................... 330/310

OTHER PUBLICATIONS

Colas et al., "A Low Noise, Large Dynamic Range Pulse Amplifier", *Nuclear Instruments and Methods*, vol. 176, No. 1, Oct. 2, 1980, pp. 283-286.

*Primary Examiner*—James B. Mullins
*Attorney, Agent, or Firm*—Thomas A. Briody; William J. Streeter; Marianne R. Rich

[57] ABSTRACT

The base of a transistor constitutes the input of an amplifier arrangement, to which an input signal may be applied. The emitter of this transistor is coupled to the negative power-supply terminal by means of a first resistor. The collector of this transistor is coupled to the input terminal of a first current multiplier circuit, whose output terminal is connected to the output of the amplifier arrangement and to the emitter of the transistor by means of a second resistor. The first current multiplier circuit further has a sum terminal which is connected to the positive power-supply terminal. In order to reduce the distortion in the arrangement it further comprises a second current multiplier circuit whose input terminal is connected to the collector of the transistor and whose sum terminal is connected to the input terminal of the first current multiplier circuit. The output of the second current multiplier circuit is connected to the negative supply terminal of the transistor.

4 Claims, 9 Drawing Figures

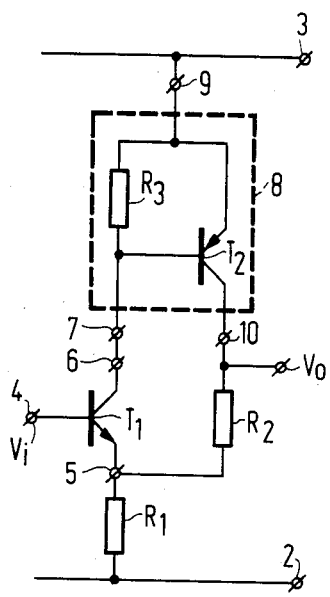
FIG.1 (PRIOR ART)
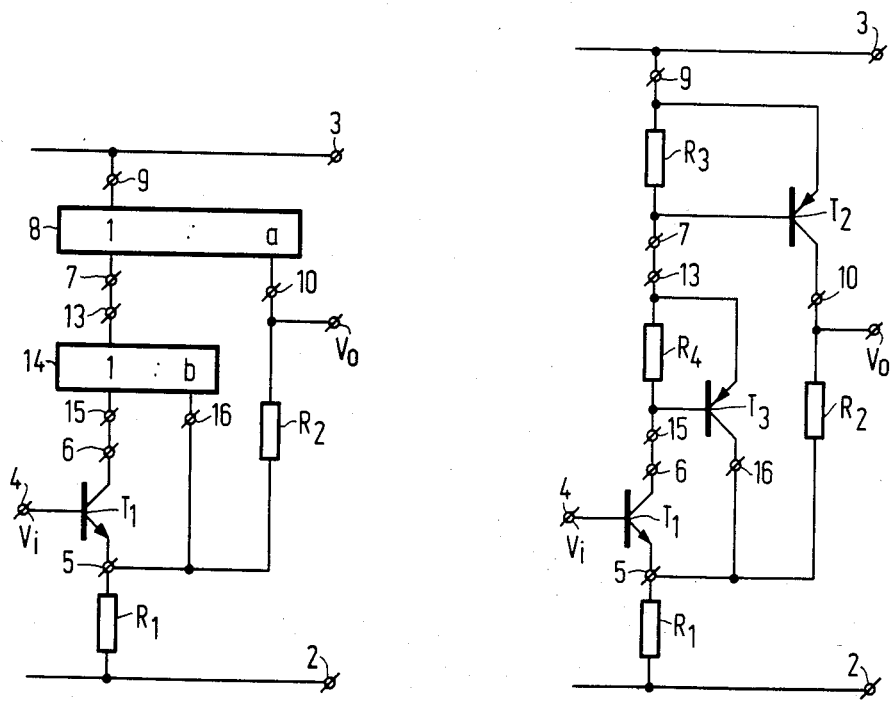
FIG.2a (PRIOR ART)
FIG.2b (PRIOR ART)

18# FEEDBACK AMPLIFIER WITH REDUCED DISTORTION

BACKGROUND OF THE INVENTION

1. Field of the Invention

The invention relates to an amplifier arrangement having an input and an output and comprising, between a first and a second power-supply terminal, a first transistor having a control terminal coupled to the input of the amplifier arrangement, a first main terminal connected to a first end of a first resistor whose second end is coupled to the first power-supply terminal, and a second main terminal coupled to an input terminal of a first current multiplier circuit, which multiplier circuit has an output terminal for supplying the multiplied input current and a sum terminal for supplying the sum of the currents in the input terminal and the output terminal, which sum terminal is coupled to the input terminal of a second current multiplier circuit which has an output terminal for supplying the multipled input current and a sum terminal for supplying the sum of the currents in the input terminal and the output terminals which sum terminal is coupled to the second power-supply terminal.

Such an amplifier arrangement may be used for various purposes in audio and video amplifiers and, in particular, as an input amplifier in a radio receiver.

2. Description of the Prior Art

Such a circuit arrangement is known from the article "A low-noise large dynamic range pulse amplifier" in Nuclear Instruments & Methods, Vol. 176, no. 1, Oct. 2, 1980, pages 283–286. The output terminals of the first and the second current multiplier circuit in this arrangement are connected to the first end of the first resistor. The amplifier arrangement may be of the non-inverting type, in which case the output voltage is available across the first resistor, or of the inverting type, in which case the output voltage appears across a resistor which connects the sum terminal of the second current multiplier circuit to the second power-supply terminal. The first and the second current multiplier circuit provide stray negative feedback for the amplifier arrangement, so that the output signal has only a low distortion.

SUMMARY OF THE INVENTION

It is the object of the present invention to improve the known circuit arrangement in such a way that distortion is reduced even further.

If the arrangement is a non-inverting amplifier, in which the output terminal of the second current multiplier circuit is connected to the first end of the first resistor via a second resistor and in which the output of the amplifier arrangement is connected to that end of the second resistor which is remote from the first end, the output terminal of the first current multiplier circuit, in accordance with a first solution, may be connected to the first power-supply terminal and, in accordance with a second solution, it may be connected to that end of the second resistor which is remote from the first end. As a result of the negative feedback in the amplifier aranement the current through the first resistor is always substantially undistorted. In the first embodiment the current through the second resistor is therefore substantially distortion-free, because the components causing the distortion are drained to the first power-supply terminal via the first current multiplier circuit, so that substantially the same current will flow through the first resistor and through the second resistor. In the second embodiment the current through the second resistor is substantially distortion-free, because again the current through the second resistor is substantially the same as that through the first resistor.

If the resistance value of the second resistor is chosen to be zero, the non-inverting amplifier becomes a voltage-follower circuit.

If the amplifier arrangement operates as an inverting amplifier in which the sum terminal of the second current multiplier circuit is connected to the second power supply terminal via a third resistor and the output of the amplifier arrangement is connected to that end of the third resistor which leads to the sum terminal of the second current multiplier circuit, the output terminal of the first current multiplier circuit, in accordance with a third solution may be connected, by means of a capacitor to that end of the third resistor which leads to the sum terminal of the second current multiplier circuit.

The distortion of the output signal in the amplifier arrangements in accordance with the invention may be reduced even further if, in accordance with a further embodiment, at least a third current multiplier circuit is arranged between the second main terminal of the first transistor and the input terminal of the first current multiplier circuit, which third multiplier circuit has an output terminal to which the multiplied current from the input terminal is supplied and a sum terminal on which the sum of the currents in the input terminal and the output terminal appears and which is coupled to the input terminal of the first current multiplier circuit.

BRIEF DESCRIPTION OF THE DRAWINGS

Embodiments of the invention will now be described in more detail, by way of example, with reference to the accompanying drawings, in which:

FIG. 1 shows a known amplifier arrangement,

FIG. 2a shows the basic diagram of a known non-inverting amplifier arrangement,

FIG. 2b shows a practical version of the arrangement shown in FIG. 2a,

DESCRIPTION OF THE PREFERRED EMBODIMENTS

Figure 3:
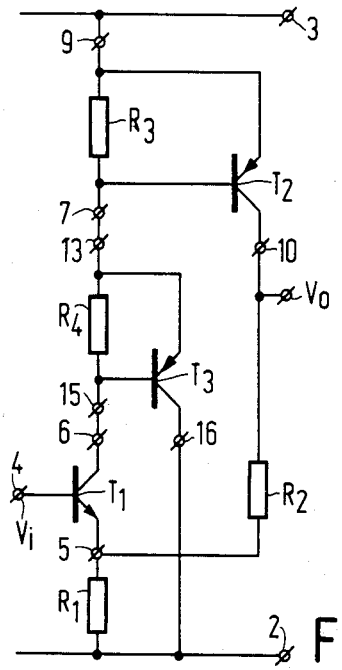
FIG. 3 shows a first non-inverting amplifier arrangement in accordance with the invention.

FIG. 1 shows a known amplifier arrangement which operates as a non-inverting amplifier. The arrangement comprises an NPN-transistor $T_1$ whose emitter 5 is connected to the negative power-supply terminal 2 by means of a resistor $R_1$ and whose base is connected to the input 4 of the amplifier arrangement, to which the input signal $V_i$ is applied. The collector 6 of transistor $T_1$ is connected to the input 7 of a current multiplier circuit 8 comprising a resistor $R_3$ arranged in parallel with the base-emitter junction of a PNP-transistor $T_2$. The sum terminal 9 of the current multiplier, which is the junction point of the emitter of transistor $T_2$ and the resistor $R_3$, is connected to the positive power-supply terminal 3. The collector 10 of transistor $T_2$ is connected to the emitter 5 of transistor $T_1$ by means of a resistor $R_2$. The output voltage $V_o$ appears across the resistors $R_1$ and $R_2$. Owing to the voltage division between $R_1$ and $R_2$ a fraction of this output voltage is applied to the emitter 5 of transistor $T_1$, resulting in negative feedback. As a result of this negative feedback the voltage on the emitter 5 of transistor $T_1$ is substantially undistorted in comparison with the input voltage $V_i$ applied to the base, so that the current through resistor $R_1$ is substantially undistorted. In order to obtain an undistorted output voltage the current through resistor $R_2$ should also be undistorted and, since the current through resistor $R_1$ is equal to the sum of the currents through resistor $R_2$ and transistor $T_1$, the current through transistor $T_1$ should also be undistorted. However, the currents through transistor $T_1$ and resistor $R_2$ cannot both be undistorted, because the current through transistor $T_1$ is equal to the sum of the current through transistor $T_3$ and the base current of transistor $T_2$, which currents both have a non-linear relationship with the collector current of transistor $T_2$. Therefore, the current through resistor $R_2$ is distorted, so that the output voltage $V_o$ is also distorted. The distortion of the output voltage also follows from the equation for the gain of the arrangement. If the transconductances of the transistors $T_1$ and $T_2$ are $S_1$ and $S_2$, respectively it is easy to see that this gain is equal to:

$$A = \frac{V_o}{V_i} = \frac{\frac{1}{1 + 1/a} \cdot \frac{R_2}{R_2} + 1}{1 + \frac{1}{S_1 R_1 (1 + a)}} \quad (1)$$

where $a = S_2 R_3$ is the multiplication factor of the current multiplier. For simplicity the base currents of the transistors are ignored. If $D_1 = (1 + 1/a)^{-1}$ and $D_2 = S_1 R_1 (1 + a)^{-1}$ this equation becomes $$A = \frac{D_1 \cdot \frac{R_2}{R_1} + 1}{1 + D_2} \quad (2)$$

The factors $D_1$ and $D_2$ depend on signal currents and are the factors which give rise to distortion. For a minimal distortion it is desirable that $D_1 = 1$ and $D_2 = 0$, which means maximal factor $a$ and a maximal transconductance $S_1$. However, increasing the bias current through transistor $T_1$ imposes limitations on the value of resistor $R_3$ and hence on the transconductance $S_2$, and conversely, increasing the value of the resistor $R_3$ limits the bias current through transistor $T_1$ and consequently the transconductance $S_2$. Therefore, the factors $D_1$ and $D_2$, cannot be made arbitrarily small.

FIG. 2a shows the basic circuit diagram of a non-inverting amplifier arrangement known from the aforementioned article, in which similar parts bear the same reference numerals as in FIG. 1. The first current multiplier circuit is shown schematically and bears the reference numeral 8. The sum terminal 9 of the current multiplier 8 is again connected to the positive power-supply terminal 3 and the output terminal 10 is again connected to the emitter 5 of the transistor $T_1$ via a resistor $R_2$. The input terminal 7 is connected to the sum terminal 13 of the second current multiplier 14, whose input terminal 15 is connected to the collector 6 of transistor $T_1$. In the present example the output terminal 16 is connected to the emitter 5 of transistor $T_1$. If the transconductance of transistor $T_1$ is again $S_1$ and the multiplication factors of the current multipliers 8 and 14 are $a$ and $b$, respectively, it follows readily that the gain satisfies the following relationship $$A = \frac{\frac{1}{1 + \frac{1}{a}} \cdot \frac{R_2}{R_1} + 1}{1 + \frac{1}{S_1 R_1 (1 + a + ab + b)}} \quad (3)$$

Comparing formula (3) with formulas (1) and (2) shows that by the addition of the second current multiplier 14 the factor $D_2$ is reduced as a result of the increased loop gain, thereby also reducing the distortion of the output voltage.

FIG. 2b shows a practical version of the arrangement shown in FIG. 2a. The first current multiplier 8 is of the same type as the current multiplier in FIG. 1, i.e. it comprises a resistor $R_3$ and a transistor $T_2$. The current multiplier 14 is of the same type and comprises a resistor $R_4$ and a PNP-transistor $T_3$ whose base emitter junction is arranged in parallel with this resistor. If the transconductances of the transistors $T_2$ and $T_3$ are $S_2$ and $S_3$, respectively, the multiplication factors in equation 3 are given by $a = S_2 R_3$ and $b = S_3 R_4$.

A first non-inverting amplifier arrangement in accordance with the invention is shown in FIG. 3 in which identical parts bear the same reference numerals as in FIG. 2b. The arrangement differs from that shown in FIG. 2b in that the output terminal 16 of the second current multiplier is not connected to the emitter 5 of transistor $T_1$ but to the negative power supply terminal 2. If the transconductance of transistor $T_1$ is again $S_1$ and the multiplication factors of the first and the second current multiplier are again $a = S_2 R_3$ and $b = S_3 R_4$, where $S_2$ and $S_3$ are the transconductances of transistors $T_2$ and $T_3$, respectively, the gain will comply with:

$$A = \frac{\frac{1}{1 + \frac{1}{a + ab}} \cdot \frac{R_2}{R_1} + 1}{1 + \frac{1}{S_1 R_1 (1 + a + ab)}} \quad (4)$$

A comparison of formula (4) with formulas (1) and (2) shows that not only the factor $D_2$ has descreased but that the factor $D_1$ more closely approximates to the value 1. A comparison with formula (3) shows that compared with the arrangement of FIG. 2 the arrangement of FIG. 3 leads to an even further reduction of the distortion. This may be explained as follows. In order to obtain a distortion-free output voltage $V_o$ the currents through the resistors $R_1$ and $R_2$ must be undistorted. The negative feedback ensures that the current through the resistor $R_1$ is substantially undistorted. If it is assumed that the current through the resistor $R_2$ is undistorted, the current in the sum terminal 13 will be distorted owing to the non-linear relationship between the collector current of transistor $T_2$ and the current through resistor $R_3$ and between the collector current of $T_2$ and the base current of this transistor. Most of this distorted current, for example 90% in the case of a multiplication factor $b = 9$, is drained to the negative power-supply terminal 2 via transistor $T_3$. The current through the resistor $R_2$ is then substantially equal to the current through resistor $R_1$, so that the current through resistor $R_2$ is substantially undistorted. In the arrangement of FIG. 2b, if the same reasoning is adopted, the distorted current through transistor $T_3$ is fed to the first resistor, so that the current through resistor $R_2$ is not equal to the current through resistor $R_1$ and therefore neither is it undistorted.

Figure 4:
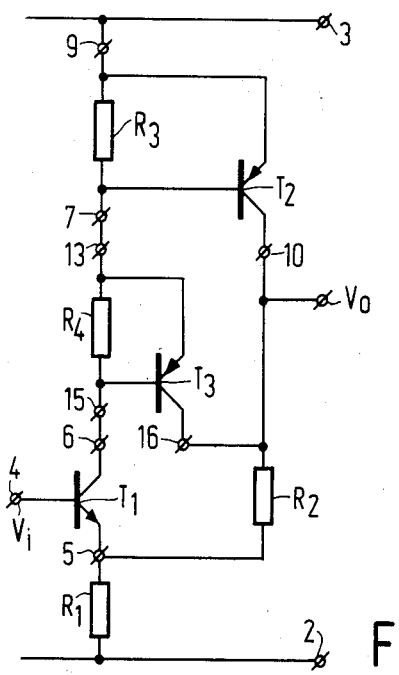
FIG. 4 shows a second non-inverting amplifier arrangement in accordance with the invention.

FIG. 4 shows a second non-inverting amplifier arrangement in accordance with the invention, in which identical parts bear the same reference numerals as in FIG. 3. The arrangement differs from that in FIG. 3 in that the output terminal 16 of the second current multiplier is not connected to the negative power-supply terminal 2 but to the output terminal 10 of transistor $T_2$. It is easy to demonstrate that the gain of the circuit complies with:

$$A = \frac{\frac{1}{1 + \frac{1}{a + ab + b}} \cdot \frac{R_2}{R_1} + 1}{1 + \frac{1}{S_1 R_1(1 + a + ab + b)}} \quad (5)$$

A comparison of this formula with formulas (1) and (2) again shows that the distortion is reduced because the factor $D_2$ has decreased and because the factor $D_1$ more closely approximates to the value 1. The reduced distortion may also be explained as follows. In order to obtain a substantially undistorted output voltage, the currents through resistors $R_1$ and $R_2$ should be substantially undistorted. The negative feedback ensures that the current through the resistor $R_1$ is substantially undistorted. As most of the current in sum terminal 13 is fed to the resistor $R_2$ via transistor $T_3$, the current through the resistor $R_2$ is substantially equal to the current through resistor $R_1$, so that the current through resistor $R_2$ is also substantially undistorted.

The value of the resistor $R_2$ in the arrangements of FIGS. 3 and 4 may be selected to be zero, so that the non-inverting amplifier becomes a voltage-follower circuit.

Figure 5:
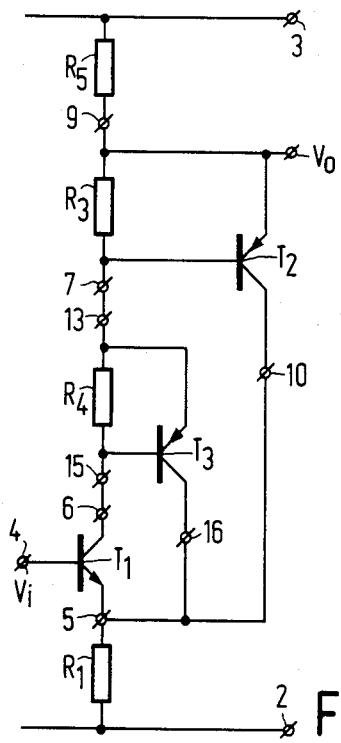
FIG. 5 shows a known inverting amplifier arrangement.

FIG. 5 shows an amplifier arrangement known from said article and constructed as an inverting amplifier. Identical parts bear the same reference numerals as in FIG. 4. The arrangement is operated as an inverting amplifier in that the sum terminal 9 of the first current multiplier is connected to the positive power-supply terminal 3 by means of a resistor $R_5$ and the output voltage $V_o$ appears across this resistor $R_5$. The output terminals 10 and 16 of the first and the second current multiplier circuit respectively are connected to the emitter 5 of transistor $T_1$. The following equation can be derived in a simple manner for the gain of the arrangement:

$$A = \frac{\frac{R_4}{R_1}}{1 + \frac{1}{S_1 R_1(1 + a)(1 + b)}} = \frac{\frac{R_4}{R_1}}{1 + D_2} \quad (6)$$

It is simple to demonstrate that the second current multiplier the factor $D_2$ is reduced by a factor $(1+b)$ which also reduces the distortion.

Figure 6:
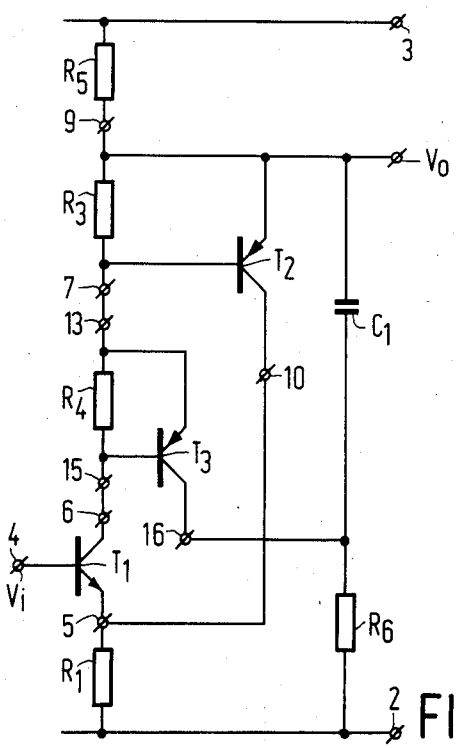
FIG. 6 shows a first inverting amplifier arrangement in accordance with the invention.

A first inverting amplifier arrangement in accordance with the invention is shown in FIG. 6, in which identical parts bear the same reference numerals as in FIG. 5. By means of a capacitor $C_1$ the output terminal 16 of the second current multiplier circuit is connected to the sum terminal 9 of the first current multiplier and by means of a resistor $R_6$ it is connected to the negative power-supply terminal 2. The signal current through the resistor $R_1$ is substantially distortion-free owing to the negative feedback. For a distortion-free output voltage the current through the resistor $R_5$ should be distortion-free. The current through resistor $R_1$ flows mainly through transistor $T_2$, so that the current through this transistor is substantially distortion-free. Then the current through resistor $R_3$ and the base current of transistor $T_2$ are not distortion-free. For the greater part these distortion components are fed back to the first current multiplier circuit via transistor $T_3$ and capacitor $C_1$, so that the distortion components appear in a closed loop and cannot reach the resistors $R_1$ and $R_5$. The voltage across the resistor $R_5$ is therefore substantially distortion-free. The gain of the arrangement then complies with:

$$A = \frac{\frac{R_4}{R_1}}{1 + \frac{1}{SR_1(1 + a + ab)}} = \frac{\frac{R_4}{R_1}}{1 + D_2} \quad (7)$$

from which it readily follows that the factor $D_2$ is reduced by thus adding the second current multiplier circuit.

Figure 7:
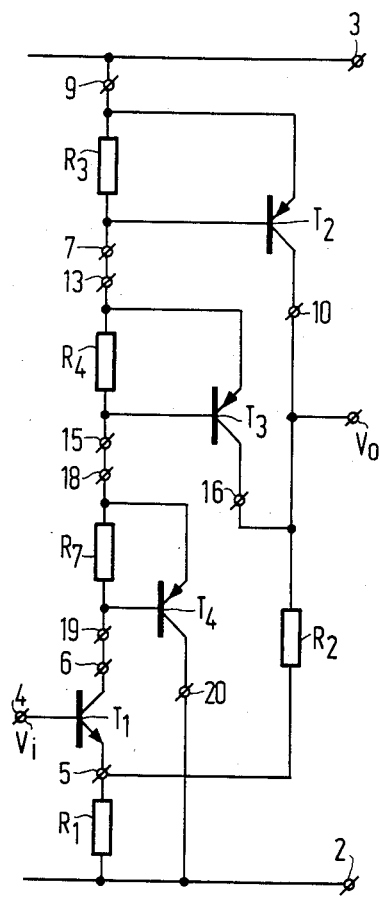
FIG. 7 shows a third non-inverting amplifier arrangement in accordance with the invention.

In the amplifier arrangements shown the distortion of the output voltage may be reduced even further by arranging at least a third current multiplier between the collector of transistor $T_1$ and the input terminal of the second current multiplier. This will be explained by means of two examples. A non-inverting amplifier arrangement as shown in FIG. 4 provided with a third current multiplier is shown in FIG. 7, in which identical parts bear the same reference numerals. The third current multiplier comprises a resistor $R_7$ arranged in parallel with the base-emitter junction of a transistor $T_4$. The input terminal 19 is connected to the collector 6 of transistor $T_1$ and the sum terminal 18 is connected to the input terminal 15 of the second current multiplier. The output terminal 20 should now be connected to the negative power-supply terminal 2. Indeed, without the third current multiplier the difference between the currents through resistors $R_1$ and $R_2$ is equal to the current through transistor $T_1$. As the current through resistor $R_1$ is substantially distortion-free owing to the negative feedback, the current through transistor $T_1$ determines the distortion of the current through the resistor $R_2$. The third current multiplier substantially reduces the current through transistor $T_1$, because the greater part of the incoming current is drained to the negative power-supply terminal via transistor $T_4$. As a result of this, the current through resistor $R_2$ becomes more equal to the current through resistor $R_1$, thereby reducing the distortion of the output signal.

Figure 8:
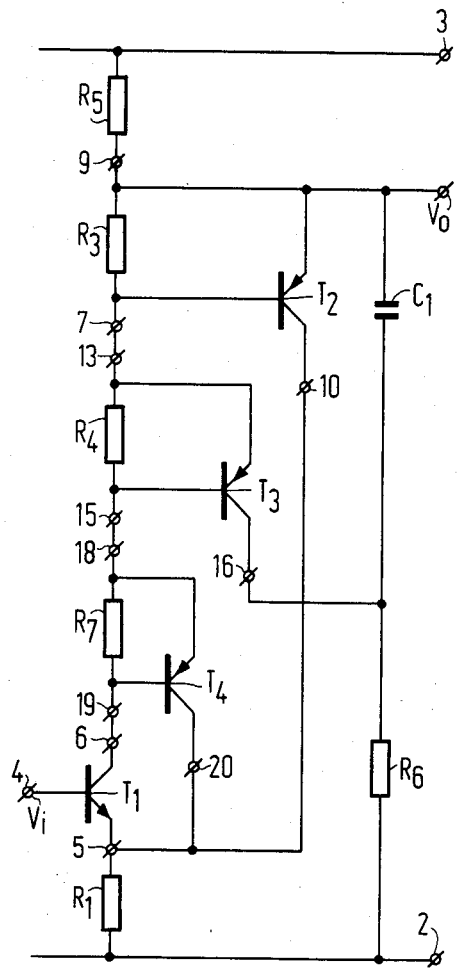
FIG. 8 shows a second inverting amplifier arrangement in accordance with the invention.

Finally, FIG. 8 shows an inverting amplifier arrangement as shown in FIG. 6, employing a third current multiplier. In the present case the output terminal 20 of the third current multiplier should be connected to the emitter 5 of the transistor $T_1$, because the current through resistor $R_5$ should be equal to the current through the resistor $R_1$, as far as this is possible. The distortion is reduced by the increased loop gain.

The invention is not limited to the embodiments shown, many variants being possible within the scope of the claims. For example, instead of the current multipliers shown, any other type of current multiplier may be employed. Further, in order to increase the quiescent current in the arrangement, a current source may be arranged in series with the resistor $R_1$, which source is decoupled for signal currents by means of a capacitor. The transistors in the present embodiments are all bipolar transistors. However, it is alternatively possible to replace all or some of the transistors by field-effect transistors. In the embodiments shown it may be advantageous, in particular, to replace only transistor $T_1$ by a field-effecttransistor. Finally, it is to be noted that the arrangement may be constructed both in integrated and in discrete form.

What is claimed is:

1. An amplifier arrangement having an input and an output and comprising, between a first and a second power-supply terminal, a first transistor having a control terminal coupled to the input of the amplifier arrangement, a first main terminal connected to a first end of a first resistor whose second end is coupled to the first power-supply terminal, and a second main terminal coupled to an input terminal of a first current multiplier circuit which multiplier circuit has an output terminal for supplying the multiplied input current and a sum terminal for supplying the sum of the currents in the input terminal and the output terminal, which sum terminal is coupled to the input terminal of a second current multiplier circuit which has an output terminal for supplying the multiplied input current and a sum terminal for supplying the sum of the currents in the input terminal and the output terminal, which sum terminal is coupled to the second power-supply terminal, characterized in that the output terminal of the second current multiplier circuit is connected to the first end of the first resistor via a second resistor and the output of the amplifier arrangement is connected to that end of the second resistor which is remote from the first end, and in that the output terminal of the first current multiplier circuit is directly connected to the first power-supply terminal.

2. An amplifier arrangement having an input and an output and comprising, between a first and a second power-supply terminal, a first transistor having a control terminal coupled to the input of the amplifier arrangement, a first main terminal connected to a first end of a first resistor whose second end is coupled to the first power-supply terminal, and a second main terminal coupled to an input terminal of a first current multiplier circuit which multiplier circuit has an output terminal for supplying the multiplied input current and a sum terminal for supplying the sum of the currents in the input terminal and the output terminal, which sum terminal is coupled to the input terminal of a second current multiplier circuit which has an output terminal for supplying the multiplied input current and a sum terminal for supplying the sum of the currents in the input terminal and the output terminal, which sum terminal is coupled to the second power-supply terminal characterized in that the output terminal of the second current multiplier circuit is connected to the first end of the first resistor via a second resistor and the output of the amplifier arrangement is connected to the end of the second resistor which is remote from the first end, and in that the output terminal of the first current multiplier circuit is connected to the end of the second resistor which is remote from the first end.

3. An amplifier arrangement as claimed in claim 2 characterized in that at least a third current multiplier circuit is arranged between the second main terminal of the first transistor and the input terminal of the first current multiplier circuit, which third current multiplier circuit has an output terminal to which the multiplied current in the input terminal is supplied and a sum terminal on which the sum of the currents in the input terminal and the output terminal appears and which is coupled to the input terminal of the first current multiplier circuit.

4. An amplifier arrangement having an input and an output and comprising between a first and a second power-supply terminal, a first transistor having a control terminal coupled to the input of the amplifier arrangement, a first main terminal connected to a first end of a first resistor whose second end is coupled to the first power-supply terminal, and a secnd main terminal coupled to an input terminal of a first current multiplier circuit, which multiplier circuit has an output terminal for supplying the multiplied input current and a sum terminal for supplying the sum of the currents in the input terminal and the output terminal which sum terminal is coupled to the input terminal of a second current multiplier circuit which has an output terminal for supplying the multiplied input current and a sum terminal for supplying the sum of the currents in the input terminal and the output terminal which sum terminal is connected to the second power-supply terminal via a third resistor and the output of the amplifier arrangement is connected to the end of the third resistor which leads to the sum terminal of the second current multiplier circuit, characterized in that the output terminal of the first current multiplier circuit is connected, by means of a capacitor, to that end of the third resistor which leads to the sum terminal of the second current multiplier circuit.

* * * * *